United States Patent
Hoekstra

(10) Patent No.: US 12,125,805 B2
(45) Date of Patent: Oct. 22, 2024

(54) ENVIRONMENTALLY PROTECTED PHOTONIC INTEGRATED CIRCUIT

(71) Applicant: EFFECT PHOTONICS B.V., Eindhoven (NL)

(72) Inventor: Tsjerk Hans Hoekstra, Eindhoven (NL)

(73) Assignee: EFFECT PHOTONICS B.V., Eindhoven (NL)

( * ) Notice: Subject to any disclaimer, the term of this patent is extended or adjusted under 35 U.S.C. 154(b) by 347 days.

(21) Appl. No.: 17/541,374

(22) Filed: Dec. 3, 2021

(65) Prior Publication Data

US 2022/0199553 A1 Jun. 23, 2022

(30) Foreign Application Priority Data

Dec. 23, 2020 (EP) .................................. 20216921

(51) Int. Cl.
*H01L 23/00* (2006.01)
*H01L 23/29* (2006.01)
*H01L 23/31* (2006.01)

(52) U.S. Cl.
CPC .......... *H01L 23/564* (2013.01); *H01L 23/293* (2013.01); *H01L 23/3192* (2013.01)

(58) Field of Classification Search
CPC . H01L 23/564; H01L 23/293; H01L 23/3192; G02B 6/4253; G02B 6/12
USPC ....................................................... 257/631
See application file for complete search history.

(56) References Cited

U.S. PATENT DOCUMENTS

| | | | |
|---|---|---|---|
| 6,294,018 B1 | 9/2001 | Hamm | |
| 6,845,184 B1 * | 1/2005 | Yoshimura | H01L 23/48 385/9 |
| 7,803,510 B2 | 9/2010 | Naiini et al. | |
| 9,952,096 B2 * | 4/2018 | Kats | G01J 3/26 |

(Continued)

FOREIGN PATENT DOCUMENTS

| | | |
|---|---|---|
| CN | 101237011 A | 8/2008 |
| CN | 101438419 A | 5/2009 |

(Continued)

OTHER PUBLICATIONS

English translation of Chinese Office Action dated Jul. 14, 2023 for corresponding Chinese Application 202111583169.0.

(Continued)

*Primary Examiner* — Caleen O Sullivan
(74) *Attorney, Agent, or Firm* — Hudak, Shunk & Farine Co. LPA

(57) ABSTRACT

An environmentally protected photonic integrated circuit, PIC, including an indium phosphide-based substrate that is at least partially covered with an epitaxial semiconductor layer. The InP-based substrate and/or the epitaxial layer are covered with a layer stack comprising different non-semiconductor layers. At least a first layer of the layer stack is provided with a through-hole that is arranged at a predetermined location. The InP-based substrate or epitaxial layer being accessible via the through-hole. The PIC including a dielectric protective layer covering the layer stack thereby provides a mechanical coupling structure. The protective layer is configured to protect the PIC from environmental contaminants. An opto-electronic system including the PIC.

20 Claims, 11 Drawing Sheets

(56) References Cited

U.S. PATENT DOCUMENTS

| | | | |
|---|---|---|---|
| 10,163,974 B2* | 12/2018 | Su | H01L 27/14689 |
| 11,262,605 B2* | 3/2022 | Lebby | G02B 6/12002 |
| 2005/0100279 A1* | 5/2005 | Joyner | G02B 6/12011 |
| | | | 385/37 |
| 2007/0099111 A1 | 5/2007 | Naiini et al. | |
| 2013/0251948 A1 | 9/2013 | Lyons et al. | |
| 2014/0252602 A1 | 9/2014 | Hua et al. | |
| 2015/0076661 A1 | 3/2015 | Musk | |
| 2016/0141836 A1* | 5/2016 | Leobandung | H01L 33/24 |
| | | | 372/45.01 |

FOREIGN PATENT DOCUMENTS

| | | |
|---|---|---|
| CN | 103650266 A | 3/2014 |
| JP | 200910260 A | 1/2009 |
| JP | 200916619 A | 1/2009 |
| JP | 2009505157 A | 2/2009 |
| JP | 5747401 A | 2/2012 |
| JP | 20155533 A | 1/2015 |
| JP | 2016184680 A | 10/2016 |
| JP | 201892836 A | 6/2018 |
| TW | 201108365 A | 3/2011 |
| TW | 201436144 A | 9/2014 |

OTHER PUBLICATIONS

English translation of Japanese Notice of Rejection Ground dated Feb. 21, 2023 for corresponding Japanese Application 2021-206567.

Taiwanese Search Report dated Oct. 6, 2022 for family member application 110142987.

* cited by examiner

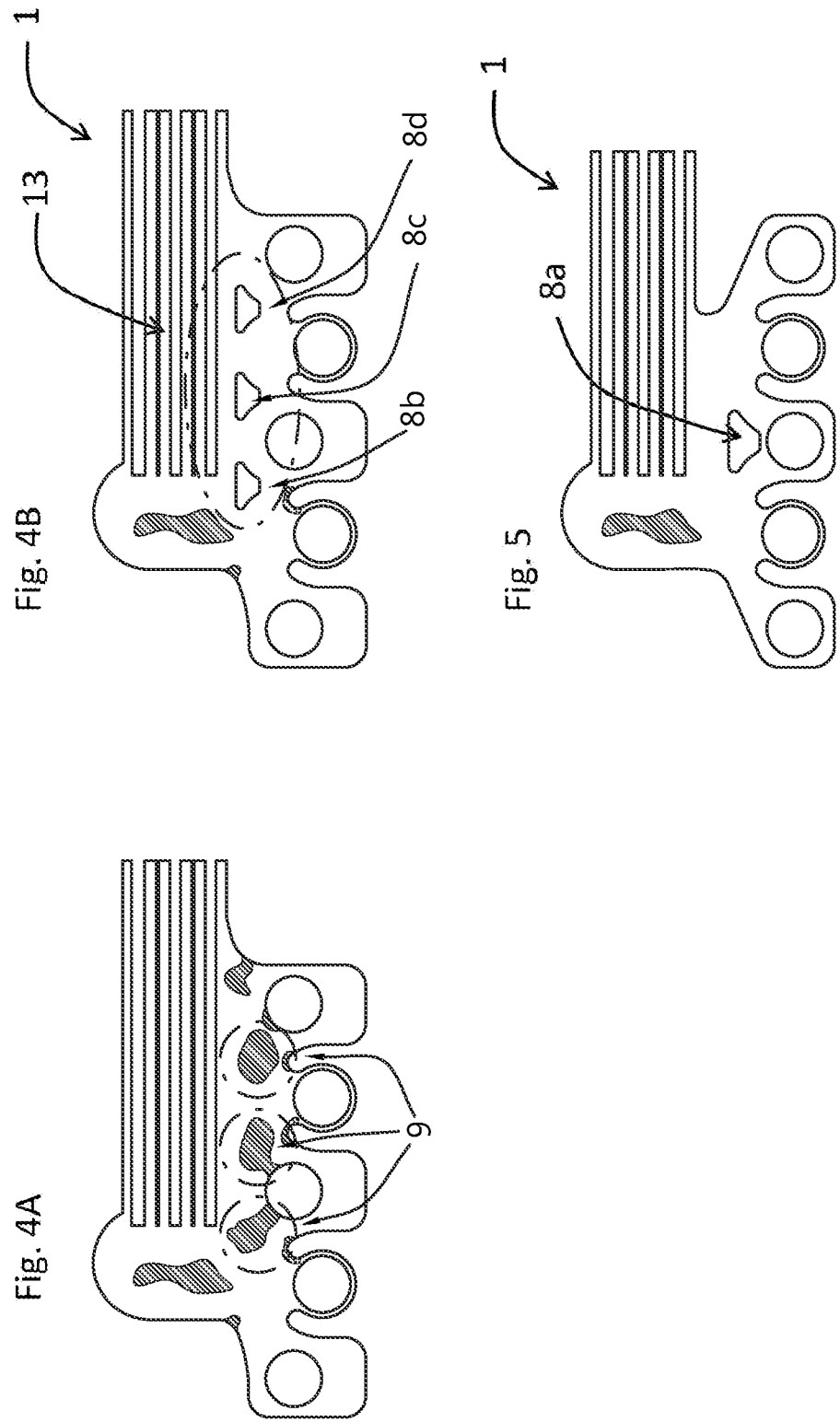

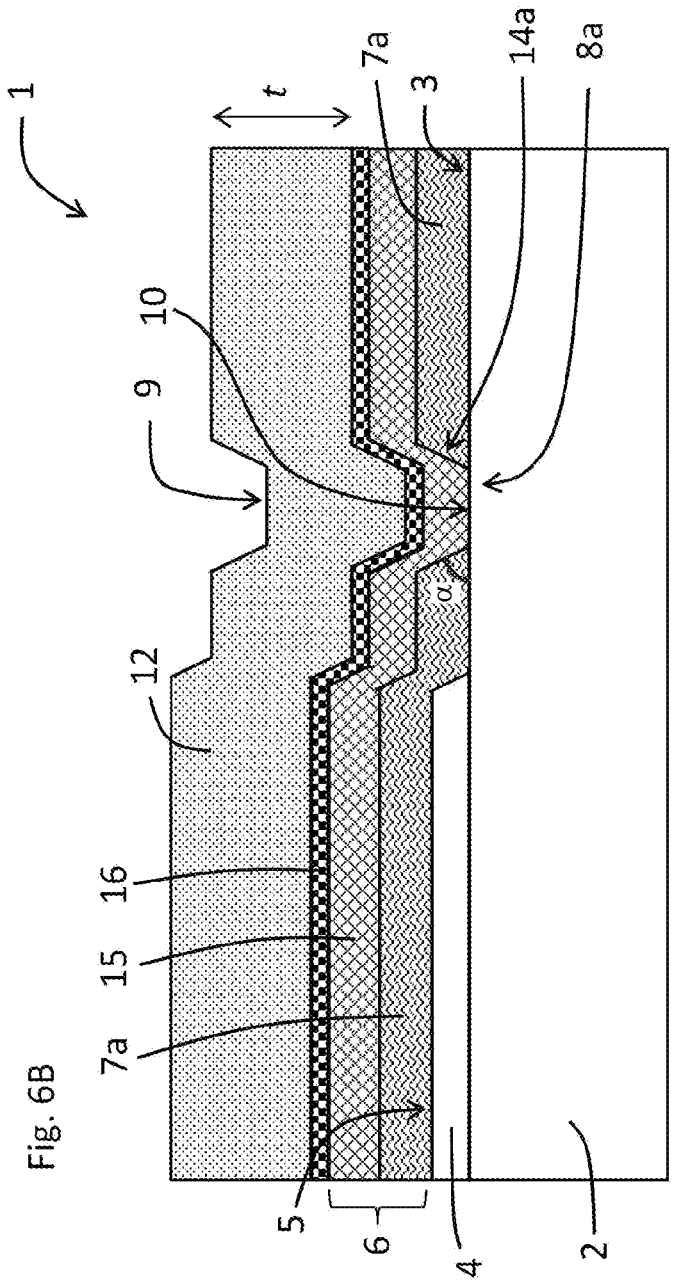

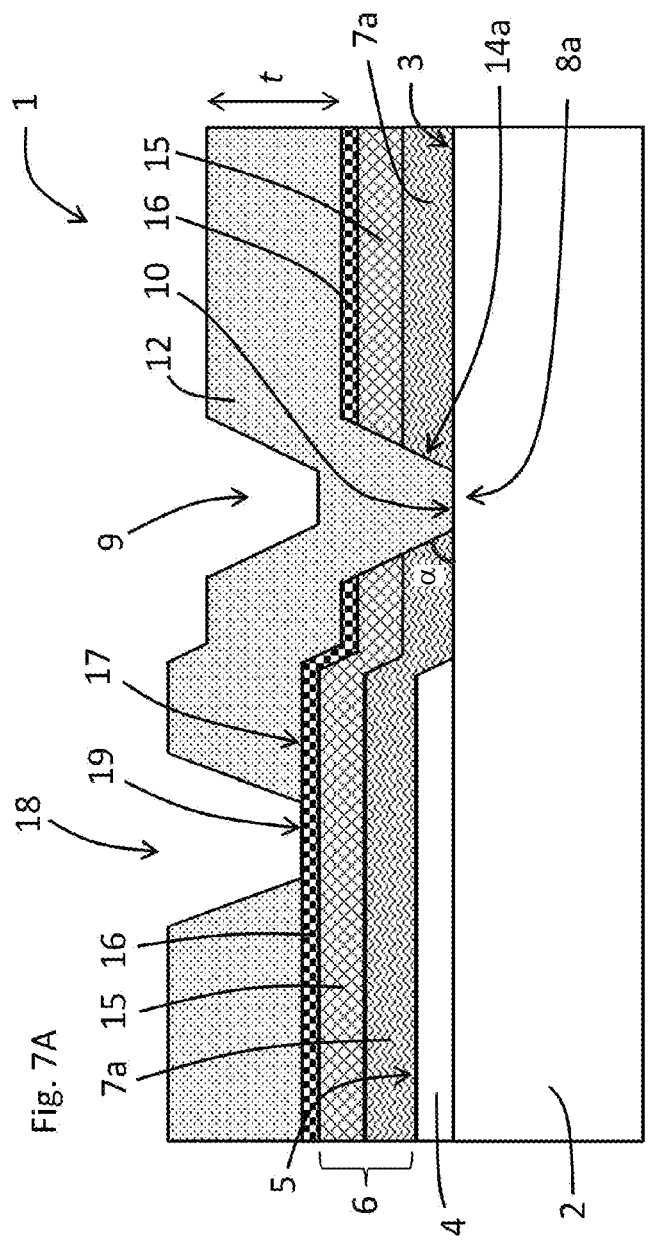

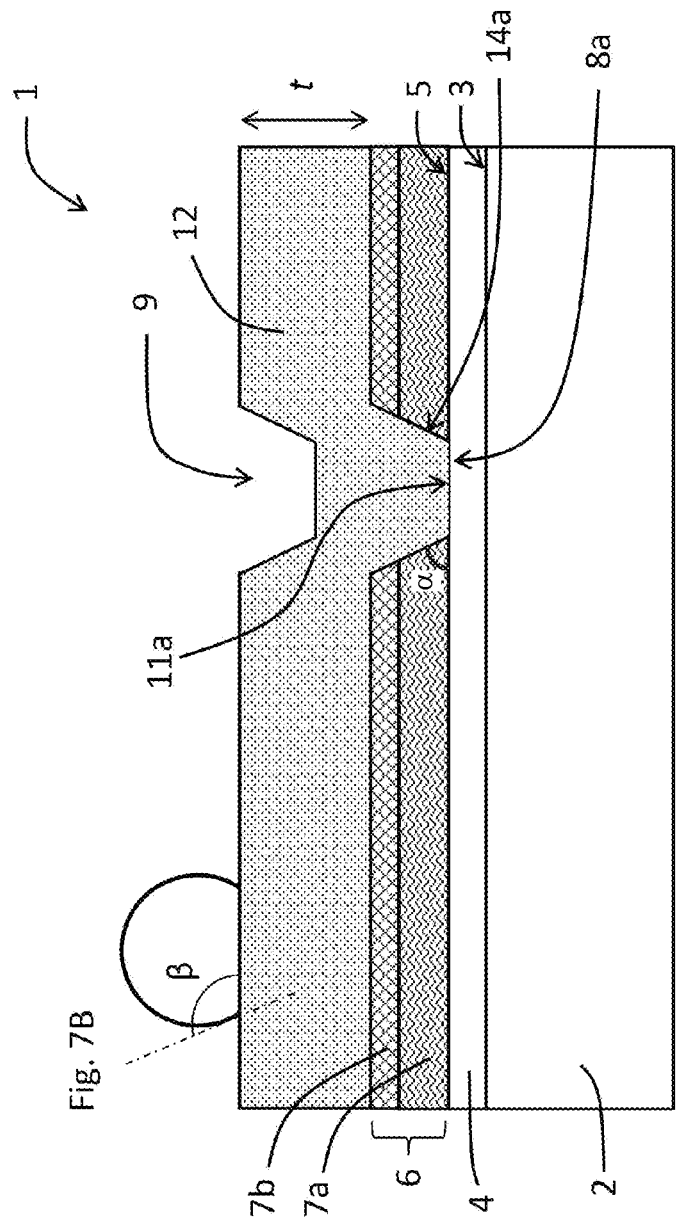

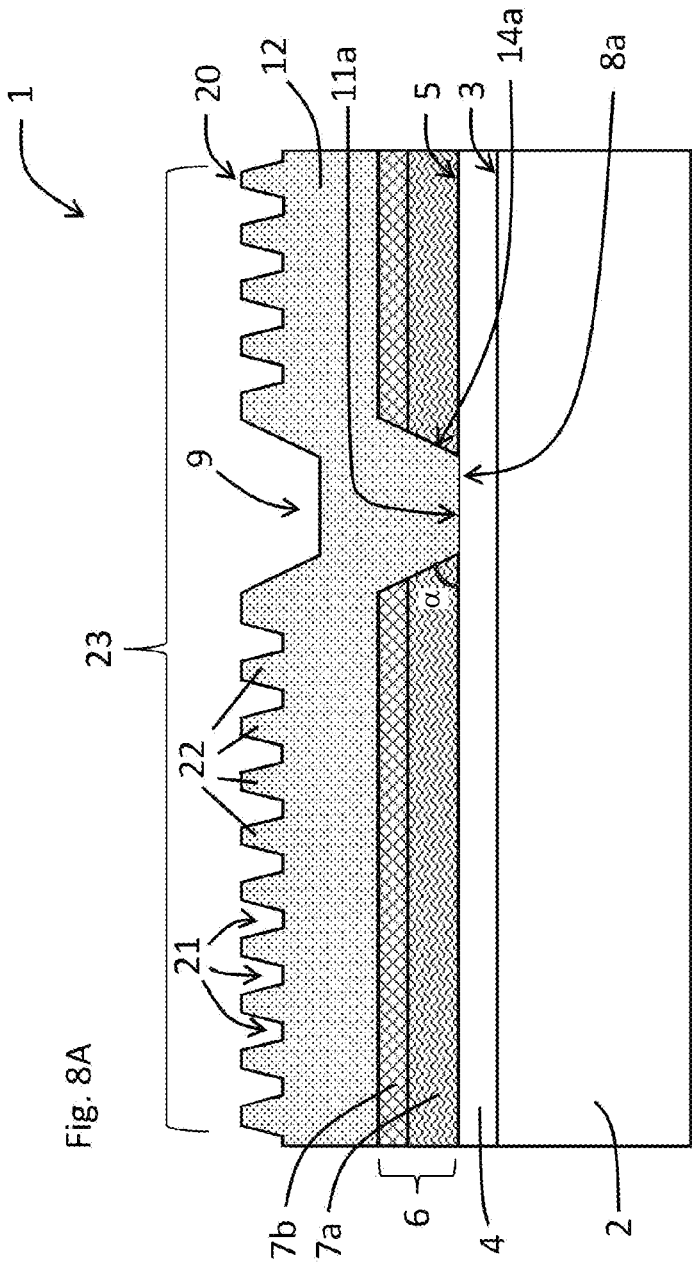

ENVIRONMENTALLY PROTECTED PHOTONIC INTEGRATED CIRCUIT

FIELD OF THE INVENTION

The present invention relates to an environmentally protected photonic integrated circuit that can be used for example but not exclusively for telecommunication applications or sensor applications. The invention further relates to an opto-electronic system that can be used for example but not exclusively for telecommunication applications or sensor applications comprising said photonic integrated circuit.

BACKGROUND OF THE INVENTION

Photonic integrated circuits (PICs), for example but not exclusively in the field of optical telecommunication applications, are becoming increasingly complex because of the increasing number of optical and electrical functions that are integrated on a single die that preferably has a footprint that is as small as possible. The most versatile technology platform for PICs for optical telecommunication applications uses wafers comprising indium phosphide-based (InP) semiconductor materials. InP-based technology enables monolithic integration of both active components such as for example light-generating and/or light-absorbing optical devices, and passive components such as for example light-guiding and/or light-switching optical devices, in one PIC on a single die.

Conventionally, environmental protection of PICs and the opto-electronic systems including them such as for example optical transceiver modules, is provided by hermetic packaging. As a result of the above-mentioned increasing complexity, the costs for assembly and in particular hermetic packaging are a significant part of the total costs of the PICs and the opto-electronic systems in which they are used.

An alternative for hermetic packaging that enables reduced assembly and packaging costs is provided by non-hermetic packaging of PICs, wherein at least one dielectric protective layer is applied to enclose the PICs thereby protecting them from environmental contaminants such as dust particles and/or moisture.

Another disadvantage of the above-mentioned increasing complexity of today's PICs is that they typically suffer from mechanical instability that occurs for example as a result of temperature excursions during at least one of processing, assembly, testing, operation and even storage of the PICs. Temperature-induced mechanical instability is mainly caused by a mismatch in coefficients of thermal expansion (CTE) of the many different kinds of materials that are used to constitute the many different components of the PICs. As a result of the mismatch in CTEs of the different kinds of materials, these materials expand and contract in different ways in dependence of temperature variations the PICs are exposed to. In particular, metal tracks that are applied on layers of materials with different CTEs can be mechanical stress raisers that give rise to mechanical instability and eventually premature failure of the PICs due to unwanted stress relaxation in the form of delamination of layers or formation of cracks in layers.

Mechanical instability can also be caused by stress that is built-in in layers of the different kinds of materials included in the PICs as a result of the methods that are used to apply these layers.

Based on the above, there is a need to provide an environmentally protected PIC that has an improved mechanical stability and thereby an increased reliability and lifetime.

SUMMARY OF THE INVENTION

It is an object of the present invention to provide an environmentally protected photonic integrated circuit, which can be used for example but not exclusively for telecommunication applications or sensor applications, pre-empting or at least reducing at least one of the abovementioned and/or other disadvantages associated with environmentally protected PICs known in the art.

It is also an object of the present invention to provide an opto-electronic system that can be used for example but not exclusively for telecommunication applications or sensor applications comprising a PIC according to the invention.

Aspects of the present invention are set out in the accompanying independent and dependent claims. Features from the dependent claims may be combined with features from the independent claim as appropriate and not merely as explicitly set out in the claims. Furthermore, all features may be replaced with other technically equivalent features.

At least one of the abovementioned objects is achieved by an environmentally protected photonic integrated circuit, comprising:

an indium phosphide-based, InP-based, substrate having a first surface that is at least partially covered with an epitaxial semiconductor layer that has a second surface that is arranged to face away from the first surface of the InP-based substrate;

a layer stack that comprises at least two different non-semiconductor layers, the layer stack being arranged to cover the first surface of the InP-based substrate and/or the second surface of the epitaxial semiconductor layer, wherein at least a layer of said layer stack that is in contact with the first surface of the InP-based substrate and/or the second surface of the epitaxial semiconductor layer is provided with a through-hole that is arranged at a predetermined location; and a first area of the first surface of the InP-based substrate or a second area of the second surface of the epitaxial semiconductor layer is accessible via the through-hole; and a dielectric protective layer that is arranged to cover said layer stack, the dielectric protective layer being arranged to at least partially fill the through-hole or a recess in said layer stack at the predetermined location thereby providing a mechanical coupling structure, the dielectric protective layer having material properties and dimensions that are configured to enable protection of the photonic integrated circuit from environmental contaminants.

The person skilled in the art will appreciate that the dielectric mechanical coupling structure that in the context of the present invention may also be referred to as a mechanical anchor, provides a mechanical connection between a non-semiconductor top layer of the layer stack and one of the first surface of the InP-based substrate and the second surface of the epitaxial InP-based semiconductor layer. By arranging the through-hole or perforation in at least the layer of the layer stack that is in contact with the first surface of the InP-based substrate and/or the second surface of the epitaxial InP-based semiconductor layer at a predetermined location, mechanical stress raisers in the layer stack can be reduced by redistributing the mechanical stresses. In this way, the mechanical coupling structure or mechanical anchor can act as a mechanical stress relieving structure thereby reducing the formation of cracks in at least the layer stack. Furthermore, by tying down the layer stack to one of the first surface of the InP-based substrate and the second surface of the epitaxial InP-based semiconductor layer, the mechanical anchor can reduce at least partial delamination of at least one of the non-semiconductor layers of the layer stack. Said delamination can occur as a result of relaxation of stress that is present in at least one of the non-semiconductor layers of the layer stack. The stress relaxation can be a result of temperature excursions during at least one of processing, assembly, testing, operation and even storage of the PIC. Based on the above, it will be clear that the dielectric protective layer of the PIC according to the present invention is a multifunctional layer that provides a PIC with an improved reliability and lifetime.

The person skilled in the art will appreciate that the predetermined location at which the through-hole is provided, for example can be a location of elevated mechanical stress. Such a location of elevated mechanical stress can be determined in a number of ways, for example in an empirical way as a result of for example failure analysis, or by performing a mechanical stress simulation, such as for example a finite element method (FEM) analysis, of a model of the PIC. Despite the foregoing, it is noted that the through-hole can be provided at any predefined location at which it enables an improved mechanical coupling between interconnected layers that are separated by at least one intermediate layer. Consequently, delamination of the interconnected layers and crack formation in the interconnected layers can be reduced and ultimately be prevented.

It is noted that by providing the through-hole in at least a first layer of the layer stack that is in contact with the first surface of the InP-based substrate and/or the second surface of the epitaxial InP-based semiconductor layer, the dielectric protective layer is not in direct contact with one of the first surface of the InP-based substrate and the second surface of the epitaxial InP-based semiconductor layer because the at least second non-semiconductor layer that is arranged between said first layer of the layer stack and the dielectric protective layer is not interrupted by the through-hole.

The person skilled in the art will appreciate that if in accordance with an exemplary, non-limiting embodiment of the PIC according to the present invention, all non-semiconductor layers of the layer stack are provided with the through-hole, i.e. the through-hole interrupts all non-semiconductor layers of the layer stack at the same location, the dielectric protective layer is in direct contact with one of the first area of the first surface of the InP-based substrate and the second area of the second surface of the epitaxial InP-based semiconductor layer.

The person skilled in the art will appreciate that a primer may be required to activate the first area of the first surface of the InP-based substrate or the second area of the second surface of the epitaxial InP-based semiconductor layer that is accessible via the individual through-hole to improve the adhesion between the dielectric protective layer and the activated surface of the first area of the first surface of the InP-based substrate or the second area of the second surface of the epitaxial InP-based semiconductor layer. It will be clear that a suitable primer can be selected taking into account the composition of the dielectric protective layer and the composition of the InP-based substrate or epitaxial semiconductor layer.

Based on the above-mentioned two exemplary, non-limiting embodiments regarding the provision of the through-hole to the non-semiconductor layers of the layer stack, i.e. providing the through-hole only in said first non-semiconductor layer of the layer stack on the one hand and providing the through-hole in all non-semiconductor layers of the layer stack on the other hand, it will be clear that depending on the number of non-semiconductor layers and the actual arrangement of the different non-semiconductor layers with respect to each other, all possible embodiments regarding the provision of the through-hole in the non-semiconductor layers of the layer stack can be envisaged. However, it is to be noted that in the context of the present invention, said first non-semiconductor layer of the layer stack is always provided with the through-hole.

The mechanical coupling structure provided in the PIC according to the present invention provides an improved way for reducing stress formation in the layer stack compared to known ways involving at least one of modification of the non-semiconductor materials used in the layer stack and reduction of the temperature budget the layer stack is subjected to during processing of the PIC. Although the aforementioned known ways for reducing stress formation in the layer stack could enable an improved tolerance of the modified layer stack to resulting mechanical stress, the known ways usually result in suboptimal reliability and therefore suboptimal performance of the PIC. These disadvantages can be pre-empted or at least reduced by the mechanical coupling structure or mechanical anchor provided in the PIC according to the present invention.

Based on the above, the person skilled in the art will appreciate that by providing both environmental protection against environmental contaminants such as for example dust particles and moisture, and the mechanical coupling structure or mechanical anchor that is arranged to mechanically tie said layer stack down to the first surface of the InP-based semiconductor substrate or the second surface of the epitaxial InP-based semiconductor layer, the dielectric protective layer provides an environmentally protected PIC that has an improved mechanical stability and thereby an increased reliability and lifetime.

The person skilled in the art will appreciate that the number of individual through-holes that is required and the arrangement of the one or more individual through-holes across the PIC can be determined for example by taking into account the distribution of mechanical stress that is obtained from the above-mentioned a mechanical stress simulation, such as for example a mechanical stress simulation, such as for example a FEM analysis, of the model of the PIC. Any changes in the design of the PIC resulting for example in a modified topography of the PIC because of for example at least one of a modified layout of the PIC due to a modified arrangement of components integrated in the PIC with respect to each other, a modified number of the different non-semiconductor layers of the layer stack, a modified material composition of at least one of the non-semiconductor layers of the layer stack, and a modified arrangement of the different non-semiconductor layers with respect to each other in the layer stack can be accommodated in an adjusted model of the modified PIC. It will be clear that a mechanical stress simulation, such as for example a FEM analysis, of said adjusted model can result in a different distribution of mechanical stress that necessitates a different number of individual through-holes and/or a different arrangement of the individual through-holes across the modified PIC.

In addition, it is noted that the number of individual through-holes and the arrangement thereof can also be determined based on design considerations, i.e. predefined locations can be determined at which the through-holes have a smallest impact on functional structures of the PIC.

In an embodiment of the environmentally protected photonic integrated circuit according to the invention, at least the layer of said layer stack that is in contact with the first surface of the InP-based substrate and/or the second surface of the epitaxial semiconductor layer is provided with at least two through-holes that are arranged in accordance with a predetermined through-hole pattern.

The person skilled in the art will appreciate that the predetermined through-hole pattern and the actual number of at least two through-holes that are required for redistributing and thereby at least reducing the mechanical stress in the layer stack as a result of tying the layer stack down to the first surface of the InP-based substrate or the second surface of the epitaxial InP-based semiconductor layer can for example be determined by taking into account the distribution of mechanical stress that is obtained from the mechanical stress simulation, such as for example a FEM analysis, of the model of the PIC. It is also possible to determine the predetermined through-hole pattern and the actual number of at least two through-holes in an empirical way such as for example via failure analysis.

In a similar way as described above for the individually arranged through-holes, any one of the above-mentioned changes in the design of the PIC resulting for example in a modified topography of the PIC can be accommodated in an adjusted model of the modified PIC. It will be clear that a mechanical stress simulation, such as for example a FEM analysis, of said adjusted model can result in a different distribution of mechanical stress that necessitates a different predetermined through-hole pattern in terms of the actual number of at least two through-holes that is required and the arrangement of said actual number of at least two through-holes with respect to each other. Again, it is also possible to do this in an empirical way.

In an embodiment of the environmentally protected photonic integrated circuit according to the invention, at least the layer of said layer stack that is in contact with the first surface of the InP-based substrate and/or the second surface of the epitaxial semiconductor layer has a sidewall that is arranged to face the through-hole, the sidewall having a differential surface, i.e. the sidewall does not have at least one of sharp corners and discontinuous surface structures such as for example step-like protrusions and/or step-like indentations. In this way, mechanical stress raisers in the layer stack that are caused by providing at least said layer of the layer stack with the individual through-hole can be reduced and preferably be avoided. Typically, the sidewall of at least said first non-semiconductor layer of the layer stack is arranged to have a circular shape, an elliptical shape or a polygonal shape with rounded corners. The person skilled in the art will appreciate that in the event that the through-hole is provided in any one or all of the other non-semiconductor layers of the layer stack, the respective sidewalls of each of these layers together constitute a total sidewall that is arranged to face the through-hole. It will be clear that the total sidewall also has a differential surface for the same considerations as mentioned above.

In an embodiment of the environmentally protected photonic integrated circuit according to the invention, at least the layer of said layer stack that is in contact with the first surface of the InP-based substrate and/or the second surface of the epitaxial semiconductor layer has at least two sidewalls, each of said at least two sidewalls being arranged to face a respective through-hole of said at least two through-holes that are arranged in accordance with the predetermined through-hole pattern, each of said at least two sidewalls having a differential surface. For the same reasons as mentioned above, each of said at least two sidewalls is arranged to have a circular shape, an elliptical shape or a polygonal shape with rounded corners. The person skilled in the art will appreciate that in the event that said at least two through-holes that are arranged in accordance with the predetermined through-hole pattern are provided in any one or all of the other non-semiconductor layers of the layer stack, the respective at least two sidewalls of each of these layers together constitute at least two total sidewalls, each of which being arranged to face a respective through-hole of said at least two through-holes. It will be clear that each of said at least two total sidewalls has a differential surface for the same considerations as mentioned above.

In an embodiment of the environmentally protected photonic integrated circuit according to the invention, the sidewall is arranged at an angle in a range from 30°–90° with respect to the first surface of the InP-based substrate. In the case that the through-hole is only applied in the first non-semiconductor layer of the layer stack that is in contact with the first surface of the InP-based substrate and/or the second surface of the epitaxial InP-based semiconductor layer, mechanical stress redistribution in at least said first layer of the layer stack can further be optimized by tailoring the angle of the sidewall of said first layer of the layer stack in the above-mentioned range. The person skilled in the art will appreciate that in the event that the through-hole is provided in any one or all of the other non-semiconductor layers of the layer stack, the respective sidewalls of each of these layers together constitute a total sidewall that is arranged to face the through-hole. It will be clear that mechanical stress redistribution in at least the non-semiconductor layers of the layer stack that have been provided with the through-hole can further be optimized by tailoring the angle of the total sidewall in the above-mentioned range. In addition, it will be appreciated that the same holds for at least two sidewalls that result from providing said first non-semiconductor layer of the layer stack with said at least two through-holes in accordance with the predetermined through-hole pattern or at least two total sidewalls that result from providing any one or all of the other non-semiconductor layers of the layer stack with said at least two through-holes in accordance with the predetermined through-hole pattern.

In an embodiment of the environmentally protected photonic integrated circuit according to the invention, said layer stack comprises a dielectric layer and a metal layer. The person skilled in the art will appreciate that the layer stack can comprise any number of dielectric layers and metal layers that is required to achieve a desired functionality of the PIC. It will be clear that in the event of multiple metal layers, each metal layer is arranged between two dielectric layers in order to either prevent short circuits between metal parts such as for example contact pads and tracks of different metal layers and/or environmental protection. The person skilled in the art will appreciate that suitable dielectric layers are silicon nitride-based layers or polymer-based layers.

In an embodiment of the environmentally protected photonic integrated circuit according to the invention, the metal layer has a third surface that is arranged to face away from the first surface of the InP-based substrate, the dielectric protective layer being arranged to cover the third surface of the metal layer, the dielectric protective layer being provided with a contact hole that is configured to provide access to a third area of the third surface of the metal layer. In this way, an electrical connection can be established with the third area of the third surface of the metal layer. It will be clear that the dielectric protective layer can be provided with any suitable number of contact holes for establishing electrical connections with different metal parts of the metal layer that are arranged at different locations across the PIC.

In an embodiment of the environmentally protected photonic integrated circuit according to the invention, the dielectric protective layer is a polymer-based layer that comprises one of a polyacrylate, a polycarbonate, a polyimide, a polyurethane, a polyxylylene, a benzocyclobutene, a polysiloxane, and silicon. Any one of the aforementioned types of polymer-based protective layers can be applied to a full wafer comprising a plurality of PICs by one of spin coating, dip coating, screen printing, and vapor deposition. Alternatively, the polymer-based protective layer can be applied to a singulated PIC that is obtained through dicing of the full wafer, by one of dip coating, screen printing, dispensing, and vapor deposition. The person skilled in the art will appreciate that in the cases that the polymer-based protective layer is applied as a liquid phase, following its application, the polymer-based protective layer is cured or crosslinked by exposing it to a thermal treatment and/or an ultraviolet (UV) treatment in vacuum or in a specific atmosphere including at least one of oxygen ($O_2$), argon (Ar) and nitrogen ($N_2$). As a result of the curing, a toughened or hardened polymer-based protective layer is obtained that is suitable for providing protection to the PIC against environmental contaminants such as for example dust particles and moisture.

In an embodiment of the environmentally protected photonic integrated circuit according to the invention, the dielectric protective layer comprises at least one of an organic additive and an inorganic additive. By including at least one of said additives, which for example may be a filler, a getter or a stabilizer, at least one of environmental protection, mechanical stability, and chemical stability of the dielectric protective layer can be enhanced. In particular the environmental protection offered by the dielectric protective layer may further be improved by enhancing its capability of inhibiting chemical reactions or by enhancing its hydrophobicity against moisture. The latter can be achieved by applying thin layers of halogenated polymers or poly(p-xylylenes) by atomic layer deposition or molecular vapor deposition.

In an embodiment of the environmentally protected photonic integrated circuit according to the invention, the dielectric protective layer comprises a fourth surface that is arranged to face away from the first surface of the InP-based substrate, the dielectric protective layer being provided with indentations that are arranged to provide a regular pattern of protrusions at the fourth surface. In this way, the hydrophobicity of the dielectric protective layer can be enhanced in a different way than the above-mentioned way of applying thin layers of halogenated polymers or polyp-xylylenes).

In an embodiment of the environmentally protected photonic integrated circuit according to the invention, the fourth surface of the dielectric protective layer has a contact angle that is at least 50°. The person skilled in the art will appreciate that the contact angle is the angle, conventionally measured through a liquid, where a liquid-vapor interface meets a solid surface. The contact angle quantifies the wettability of a solid surface by a liquid via the Young equation. A given system of solid, liquid, and vapor at a given temperature and pressure has a unique equilibrium contact angle. However, in practice a dynamic phenomenon of contact angle hysteresis is often observed, ranging from the advancing or maximal contact angle to the receding or minimal contact angle. Values for the equilibrium contact angle range between the values for the advancing and receding contact angles and can be calculated from them. The equilibrium contact angle reflects the relative strength of the liquid, solid, and vapor molecular interaction.

Furthermore, the person skilled in the art will appreciate that the contact angle can be measured by different methods including the static sessile drop method. Using the latter measurement method, the contact angle is measured by a contact angle goniometer using an optical subsystem to capture a profile of a pure liquid on a solid substrate. The angle formed between the liquid-solid interface and the liquid-vapor interface is the contact angle. For example, a polymer-based surface having a contact angle of at least 50° is considered to be hydrophobic, whereas a hydrophilic polymer-based surface has a contact angle that is smaller than 50°. For example, in the case of polyethylene or polypropylene films, the person skilled in the art will be familiar with the ASTM D2578-17 standard test method for determining the contact angle. This test method is equivalent to ISO8296.

In an embodiment of the environmentally protected photonic integrated circuit according to the invention, the dielectric protective layer has a thickness between 0.5 µm and 100 µm, preferably between 0.5 µm and 10 µm. In this way, the thickness of the dielectric protective layer should be sufficient to limit diffusion of environmental contaminants thereby enabling environmental protection of the PIC.

In an embodiment of the environmentally protected photonic integrated circuit according to the invention, the dielectric protective layer is a conformal coating or a planarizing coating. In this way, adequate sealing of the PIC by the dielectric protective layer can be achieved.

In an embodiment of the environmentally protected photonic integrated circuit according to the invention, the photonic integrated circuit is provided with one of a non-hermetic package and a hermetic package. The environmental protection and consequently the life-time of the PIC can be improved by including the PIC in a non-hermetic package. The person skilled in the art will appreciate that the environmental protection and therefore the life-time of the PIC can be improved even further by including the PIC in a hermetic package.

In an exemplary embodiment of the environmentally protected PIC according to the invention, the photonic integrated circuit is a monolithic photonic integrated circuit.

According to another aspect of the present invention, an opto-electronic system is provided comprising an environmentally protected photonic integrated circuit according to the invention. The opto-electronic system can for example be one of a transmitter, a receiver, a transceiver, a coherent transmitter, a coherent receiver and a coherent transceiver. Based on the above, it will be clear that because of the application of the environmentally protected PIC according to the invention, the costs for the opto-electronic system can be reduced.

Further features and advantages of the invention will become apparent from the description of exemplary and non-limiting embodiments of an environmentally protected photonic integrated circuit (PIC) according to the present invention and of an opto-electronic system comprising such a PIC.

The person skilled in the art will appreciate that the described embodiments of the PIC and the opto-electronic system are exemplary in nature only and not to be construed as limiting the scope of protection in any way. The person skilled in the art will realize that alternatives and equivalent embodiments of the PIC and the opto-electronic system can be conceived and reduced to practice without departing from the scope of protection of the present invention.

BRIEF DESCRIPTION OF THE DRAWINGS

Reference will be made to the figures on the accompanying drawing sheets. The figures are schematic in nature and therefore not necessarily drawn to scale. Furthermore, equal reference numerals denote equal or similar parts. On the attached drawing sheets.

FIG. 4A shows a schematic top view of a part of an environmentally protected PIC that has not yet been provided with any through-holes according to the present invention. Regions of elevated mechanical stress in at least the two different non-semiconductor layers of the layer stack of the PIC are indicated;

FIG. 4B shows a schematic top view of a part of a fourth exemplary, non-limiting embodiment of an environmentally protected PIC according to the present invention that is based on the PIC shown in FIG. 4A that has been modified by providing it with three through-holes that are arranged in accordance with a predetermined through-hole pattern;

FIG. 5 shows a schematic top view of a part of a fifth exemplary, non-limiting embodiment of an environmentally protected PIC according to the present invention. In accordance with this embodiment, one individual through-hole is provided for redistributing the resulting mechanical stress;

FIG. 6B shows a schematic cross-section of a part of a seventh exemplary, non-limiting embodiment of an environmentally protected PIC according to the present invention in which the polymer-based protective layer partially fills a recess in the stack of at least two non-semiconductor layers at a predetermined location of elevated mechanical stress;

FIG. 7A shows a schematic cross-section of a part of an eighth exemplary, non-limiting embodiment of an environmentally protected PIC according to the present invention in which the through-hole is provided to all non-semiconductor layers of the layer stack thereby allowing direct contact between the polymer-based protective layer and the InP-based substrate;

FIG. 7B shows a schematic cross-section of a part of a ninth exemplary, non-limiting embodiment of an environmentally protected PIC according to the present invention in which the through-hole is provided to all non-semiconductor layers of the layer stack thereby allowing direct contact between the polymer-based protective layer and the epitaxial semiconductor layer;

FIG. 8A shows a schematic cross-section of a part of a tenth exemplary, non-limiting embodiment of an environmentally protected PIC according to the present invention in which a surface of the polymer-based protective layer that is arranged to face away from the InP-based substrate on which it is applied is provided with indentations that are arranged to provide a regular pattern of protrusions;

DETAILED DESCRIPTION OF EMBODIMENTS

It is noted that although the presented exemplary, non-limiting embodiments of the environmentally protected PIC 1 according to the present invention involve one polymer-based protective layer, the person skilled in the art will be able to envisage without undue burden embodiments involving more than one polymer-based protective layer and embodiments involving one or more non-polymer-based protective layers, for example silicon-containing layers such as silicon nitride or silicon oxynitride layers, falling within the scope of the present invention.

Figure 1:
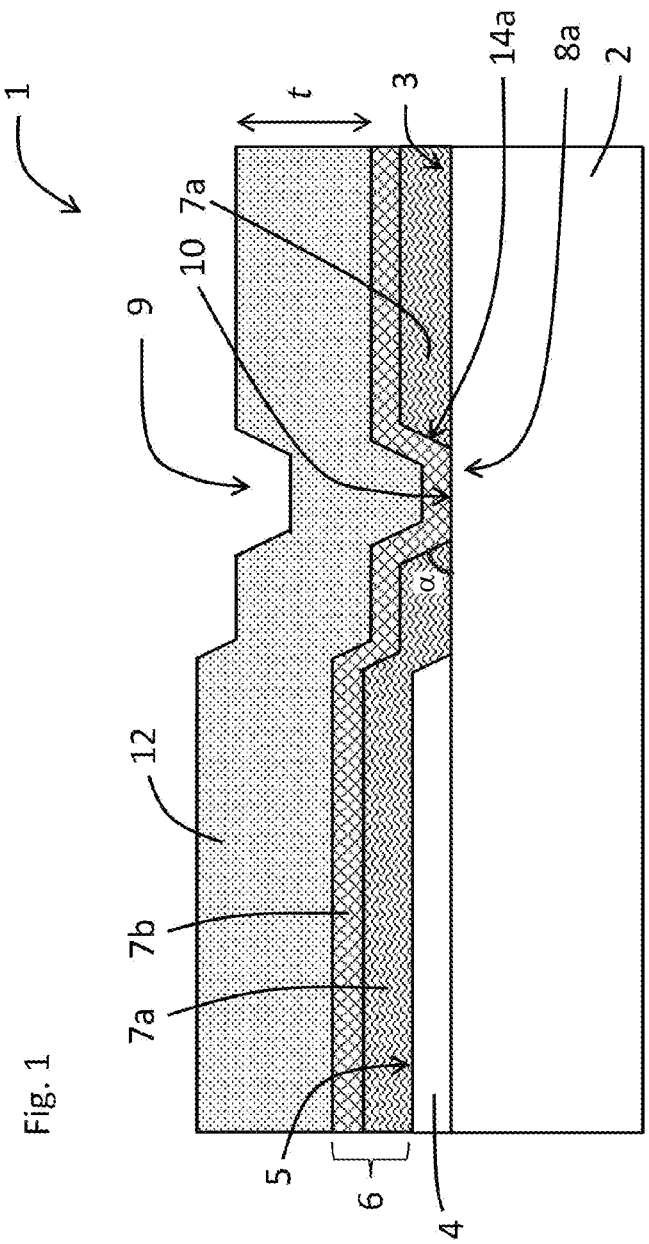
FIG. 1 shows a schematic cross-section of a part of a first exemplary, non-limiting embodiment of an environmentally protected photonic integrated circuit (PIC) according to the present invention in which a first area of a first surface of the substrate is accessible via a through-hole.

FIG. 1 shows a schematic cross-section of a part of a first exemplary, non-limiting embodiment of an environmentally protected photonic integrated circuit (PIC) 1 according to the present invention. The PIC 1 comprises an indium phosphide-based (InP-based) substrate 2 that has a first surface 3 that is partially covered with an epitaxial InP-based semiconductor layer 4 that has a second surface 5 that is arranged to face away from the first surface 3 of the substrate 2. The person skilled in the art will appreciate that more than one epitaxial InP-based semiconductor layer 4 can be applied, depending on the specific requirements of the PIC 1.

A layer stack 6 that comprises two different non-semiconductor layers 7a, 7b is arranged to cover the first surface 3 of the substrate 2 and the second surface 5 of the epitaxial InP-based semiconductor layer 4 shown in FIG. 1. A through-hole 8a is provided in a first non-semiconductor layer 7a of said layer stack 6 that is in contact with the first surface 3 of the substrate 2. As mentioned above, the through-hole 8a is arranged at a predetermined location 9 that in accordance with a mechanical stress simulation, such as a FEM analysis, of a model of the PIC 1 is identified as a location of elevated mechanical stress. A second non-semiconductor layer 7b of said layer stack 6 is in contact with the first area 10 of the first surface 3 of the InP-based substrate as the through-hole 8a in the first non-semiconductor layer 7a of said layer stack 6 provides access to the first area 10 of the first surface 3 of the InP-based substrate 2.

A polymer-based protective layer 12 is arranged to cover said layer stack 6 and protect the PIC 1 from environmental contaminants such as for example dust particles and/or moisture. The polymer-based protective layer 12 is arranged to partially fill the through-hole 8a thereby providing a mechanical coupling structure or mechanical anchor as in this way, a mechanical connection is provided between the second non-semiconductor top layer 7b of the layer stack 6 and the first surface 3 of the InP-based substrate 2. As mentioned above, the mechanical anchor enables reduction of mechanical stress raisers in the layer stack 6 by redistributing the mechanical stresses. As a result, the mechanical anchor can reduce the formation of cracks in at least the layer stack 6. Furthermore, by tying down the layer stack 6 to the first surface 3 of the InP-based substrate 2, the mechanical anchor can reduce at least partial delamination of at least one of the non-semiconductor layers 7a, 7b of the layer stack 6.

The polymer-based protective layer 12 can have a thickness t between 0.5 µm and 100 µm, preferably between 0.5 µm and 10 µm. In this way, the thickness t should be sufficient to limit diffusion of environmental contaminants thereby enabling non-hermetic packaging of the PIC 1. The polymer-based protective layer 12 preferably is a conformal coating or a planarizing coating. In this way, adequate sealing of the PIC 1 by the polymer-based protective layer 12 can be achieved.

Based on the above, it will be clear that the polymer-based protective layer 12 of the PIC 1 is a multifunctional layer that provides the PIC 1 with an improved reliability and lifetime.

FIG. 1 shows that as the through-hole 8a is only provided in the first layer 7a of the layer stack 6 that is in contact with the first surface 3 of the InP-based substrate 2, the polymer-based protective layer 12 is not in direct contact with the first surface 3 of the InP-based substrate 2 because the second non-semiconductor layer 7b that is arranged between the first non-semiconductor layer 7a of the layer stack 6 and the polymer-based protective layer 12 is not interrupted by the through-hole 8a.

Furthermore, the first non-semiconductor layer 7a of the layer stack 6 has a sidewall 14a that is arranged to face the through-hole 8a. The sidewall 14a has a differential surface, i.e. the sidewall does not have at least one of sharp corners and discontinuous surface structures such as for example step-like protrusions and/or step-like indentations. In this way, mechanical stress raisers in the layer stack 6 that are caused by providing the first non-semiconductor layer 7a of the layer stack 6 with the individual through-hole 8a can be reduced and preferably be avoided. Typically, the sidewall 14a has one of a circular shape, an elliptical shape and a polygonal shape with rounded corners.

The sidewall 14a of the first non-semiconductor layer 7a is arranged at an angle α in a range from 30°-90° with respect to the first surface 3 of the InP-based substrate 2. Mechanical stress redistribution in at least the first non-semiconductor layer 7a of the layer stack 6 can further be optimized by tailoring the angle α of the sidewall 14a of the first non-semiconductor layer 7a of the layer stack 6 in the above-mentioned range.

Figure 2:
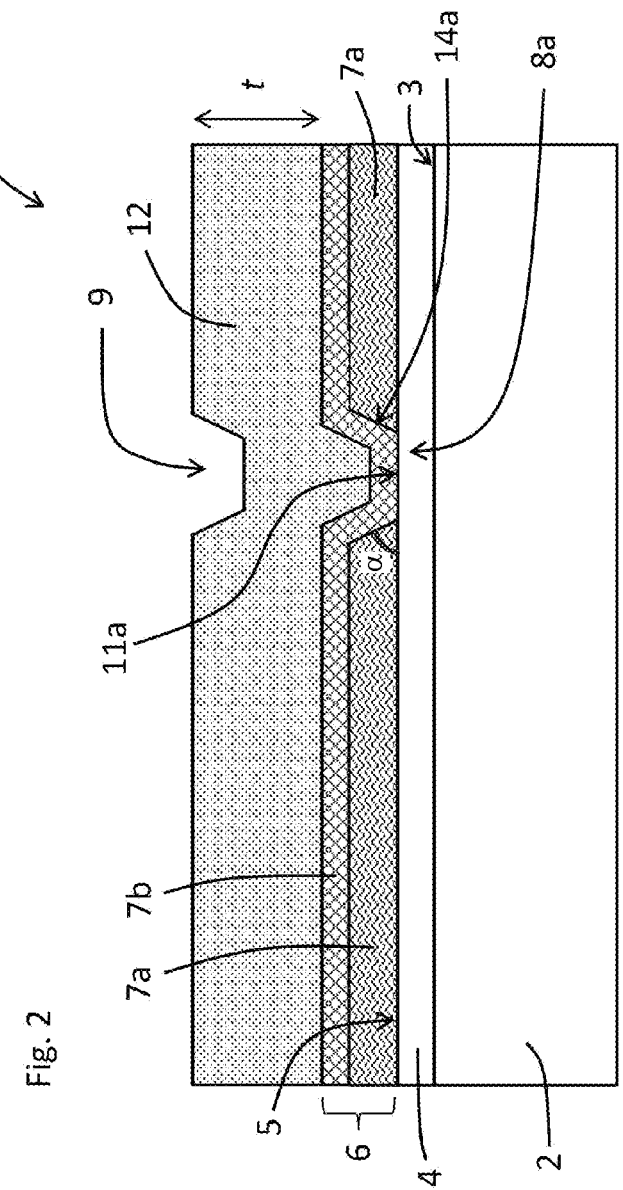
FIG. 2 shows a schematic cross-section of a part of a second exemplary, non-limiting embodiment of an environmentally protected PIC according to the present invention in which a second area of a second surface of an epitaxial semiconductor layer is accessible via a through-hole.

FIG. 2 shows a schematic cross-section of a part of a second exemplary, non-limiting embodiment of the PIC 1 according to the present invention in which the first surface 3 of the InP-based substrate 2 is completely covered with an epitaxial InP-based semiconductor layer. The person skilled in the art will appreciate that more than one epitaxial InP-based semiconductor layer can be applied, depending on the specific requirements of the PIC 1.

As the perforation or through-hole 8a is provided in the first non-semiconductor layer 7a of the layer stack 6, the through-hole 8a provides access to a second area 11a of the second surface 5 of the epitaxial InP-based semiconductor layer 4. It is noted that by providing the through-hole 8a in the first non-semiconductor layer 7a of the layer stack 6, the polymer-based protective layer 12 is not in direct contact with the second surface 5 of the epitaxial InP-based semiconductor layer 4 because the second non-semiconductor layer 7b that is arranged between the first non-semiconductor layer 7a of the layer stack 6 and the polymer-based protective layer 12 is not interrupted by the through-hole 8a.

The polymer-based protective layer 12 is arranged to partially fill the through-hole 8a thereby providing a mechanical coupling structure or mechanical anchor as mentioned above. The polymer-based protective layer 12 can also have a thickness t between 0.5 µm and 100 µm, preferably between 0.5 µm and 10 µm in order to limit diffusion of environmental contaminants thereby enabling non-hermetic packaging of the PIC 1.

The first non-semiconductor layer 7a of the layer stack 6 in the second exemplary, non-limiting embodiment of the PIC 1 also has a sidewall 14a that is arranged to face the through-hole 8a, wherein the sidewall 14a has the above-mentioned differential surface. Moreover, the sidewall 14a of the first non-semiconductor layer 7a in the second exemplary, non-limiting embodiment of the PIC 1 is also arranged at an angle α that is in a range from 30°-90° with respect to the first surface 3 of the InP-based substrate 2 in order to further optimize redistribution of mechanical stress in at least the first non-semiconductor layer 7a of the layer stack 6.

Figure 3:
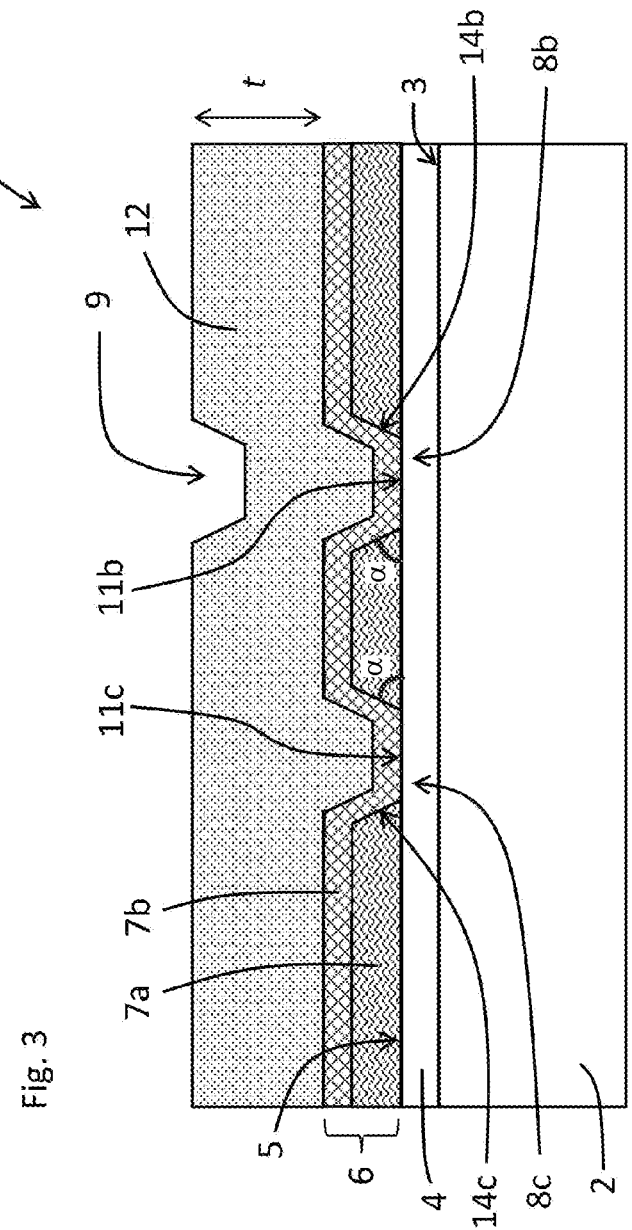
FIG. 3 shows a schematic cross-section of a part of a third exemplary, non-limiting embodiment of an environmentally protected PIC according to the present invention that is provided with two through-holes that are arranged in accordance with a predetermined through-hole pattern.

FIG. 3 shows a schematic cross-section of a part of a third exemplary, non-limiting embodiment of the PIC 1 according to the present invention. The difference with the second exemplary, non-limiting embodiment of the PIC 1 shown in FIG. 2 is that the first non-semiconductor layer 7a of the layer stack 6 is provided with two through-holes 8b, 8c that are arranged in accordance with a predetermined through-hole pattern. The two through-holes 8b, 8c provide access to two different areas 11b, 11c of the second surface 5 of the epitaxial InP-based semiconductor layer 4 that are in direct contact with the second non-semiconductor layer 7b of the layer stack 6.

In a similar way as described with respect to the individually arranged through-hole 8a that is shown for example in FIGS. 1 and 2, each one of the two sidewalls 14b, 14c of the first non-semiconductor layer 7a has the above-mentioned differential surface in order to avoid a stress raiser in the layer stack 6 as a result of providing the first non-semiconductor layer 7a with the two through-holes 8b, 8c.

Furthermore, each one of the two sidewalls 14b, 14c is arranged at an angle α in a range from 30°-90° with respect to the first surface 3 of the InP-based substrate 2 in order to further optimize redistribution of mechanical stress in at least the first non-semiconductor layer 7a of the layer stack 6.

FIG. 4A shows a schematic top view of a part of a PIC that has not yet been provided with any through-holes according to the present invention. Regions of elevated mechanical stress in at least the two different non-semiconductor layers of the layer stack of the PIC are indicated by the closed contours that are filled with stripes. These regions can be obtained for example by performing a mechanical stress simulation, such as for example a FEM analysis, of a model of the PIC. It is also possible to determine these regions in an empirical way, for example by failure analysis investigations. The regions of elevated mechanical stress enable identification of locations 9 of elevated mechanical stress at which through-holes can be provided that in cooperation with the dielectric protective layer of the invention enable redistribution of the mechanical stresses and thereby reduction of the resulting mechanical stress in the layer stack 6 of the PIC 1. As mentioned above, the locations at which the though-holes are provided can also be determined taking design considerations into account. For example, locations can be determined at which the through-holes have a smallest impact on functional structures of the PIC.

FIG. 4B shows a schematic top view of a part of a fourth exemplary, non-limiting embodiment of the PIC 1 according to the present invention that is based on the PIC shown in FIG. 4A that has been modified by providing it with three through-holes 8*b*, 8*c*, 8*d* that are arranged in accordance with a predetermined through-hole pattern 13. The actual number of the through-holes and the pattern in accordance with which they are arranged with respect to each other has been determined by taking into account the regions of elevated mechanical stress as shown in FIG. 4A. A mechanical stress simulation, such as for example a FEM analysis, of a model of the embodiment of the PIC 1 shown in FIG. 4B can provide the modified distribution of resulting elevated mechanical stress shown in FIG. 4B. From the modified distribution of the resulting elevated mechanical stress it is clear that the three through-holes 8*b*, 8*c*, 8*d* in combination with the dielectric protective layer of the present invention have successfully redistributed the mechanical stresses in the layer stack 6 of the PIC 1.

FIG. 5 shows a schematic top view of a part of a fifth exemplary, non-limiting embodiment of the PIC 1 according to the present invention. In accordance with this embodiment, one individual through-hole 8*a* is provided that in combination with the polymer-based protective layer of the present invention enables the mechanical stresses to be redistributed. A mechanical stress simulation, such as for example a FEM analysis, of a model of the fifth embodiment of the PIC 1 provides the distribution of resulting mechanical stress that is shown in FIG. 5.

Figure 6A:
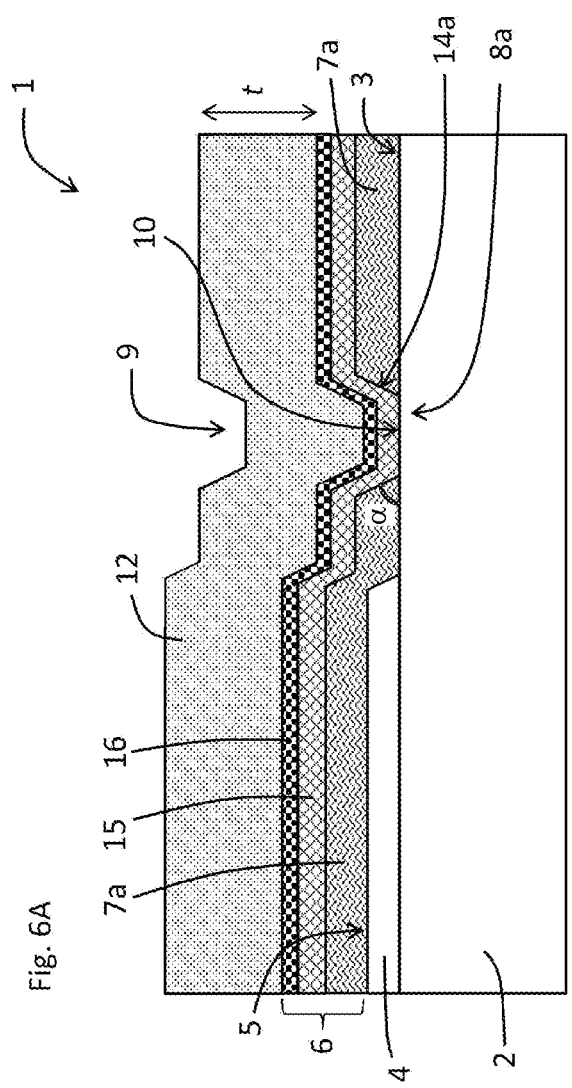
FIG. 6A shows a schematic cross-section of a part of a sixth exemplary, non-limiting embodiment of an environmentally protected PIC according to the present invention in which a polymer-based protective layer partially fills the through-hole.

FIG. 6A shows a schematic cross-section of a part of a sixth exemplary, non-limiting embodiment of the PIC 1 according to the present invention. The first non-semiconductor layer 7*a* of the layer stack 6 is covered with a dielectric layer 15 as a second layer of the layer stack 6, whereas the dielectric second layer 15 is covered with a metal layer 16 as a third layer of the layer stack 6. The first non-semiconductor layer 7*a* of the layer stack 6 is provided with the though-hole 8*a*. The first area 10 of the first surface 3 of the InP-based substrate 2 is in direct contact with the dielectric second layer 15 of the layer stack 6. The polymer-based protective layer 12 partially fills the through-hole 8*a* thereby providing the above-mentioned mechanical coupling structure or mechanical anchor. The sidewall 14*a* of the first non-semiconductor layer 7*a* has the above-mentioned differential surface in order to avoid a stress raiser in the layer stack 6 as a result of providing the first non-semiconductor layer 7*a* with the through-hole 8*a*. Furthermore, the sidewall 14*a* is arranged at an angle α in a range from 30°-90° with respect to the first surface 3 of the InP-based substrate 2 in order to further optimize redistribution of mechanical stress in at least the first non-semiconductor layer 7*a* of the layer stack 6.

FIG. 6B shows a schematic cross-section of a part of an seventh exemplary, non-limiting embodiment of the PIC 1 according to the present invention. The first non-semiconductor layer 7*a* of the layer stack 6 is covered with a dielectric layer 15 as a second layer of the layer stack 6, whereas the dielectric second layer 15 is covered with a metal layer 16 as a third layer of the layer stack 6. The first non-semiconductor layer 7*a* of the layer stack 6 is provided with the though-hole 8*a*. The first area 10 of the first surface 3 of the InP-based substrate 2 is in direct contact with the dielectric second layer 15 of the layer stack 6. The polymer-based protective layer 12 partially fills a recess in the layer stack 6 at the predetermined location 9 of elevated mechanical stress. In this way, the combination of the polymer-based protective layer 12 and the through-hole 8*a* still provide the mechanical coupling structure or mechanical anchor described above. Furthermore, the sidewall 14*a* of the first non-semiconductor layer 7*a* has the above-mentioned differential surface in order to avoid a stress raiser in the layer stack 6 as a result of providing the first non-semiconductor layer 7*a* with the through-hole 8*a*. Moreover, the sidewall 14*a* is arranged at an angle α in a range from 30°-90° with respect to the first surface 3 of the InP-based substrate 2 in order to further optimize redistribution of mechanical stress in at least the first non-semiconductor layer 7*a* of the layer stack 6.

FIG. 7A shows a schematic cross-section of a part of an eighth exemplary, non-limiting embodiment of the PIC 1 according to the present invention in which the through-hole 8*a* is provided to all non-semiconductor layers 7*a*, 15, 16 of the layer stack 6 thereby allowing direct contact between the polymer-based protective layer 12 and the first area 10 of the first surface 3 of the InP-based substrate 2. As all non-semiconductor layers 7*a*, 15, 16 of the layer stack 6 are provided with the through-hole 8*a*, the polymer-based protective layer 12 is in direct contact with the first area 10 of the first surface 3 of the InP-based substrate 2. In this way, the combination of the polymer-based protective layer 12 and the through-hole 8*a* provide the mechanical coupling structure or mechanical anchor described above. As the through-hole 8*a* is provided in all of the non-semiconductor layers 7*a*, 15, 16 of the layer stack 6, the respective sidewalls of each of these layers together constitute a total sidewall that is arranged to face the through-hole 8*a*. It will be clear that the total sidewall also has a differential surface in order to avoid a stress raiser in the layer stack 6 as a result of providing the non-semiconductor layers 7*a*, 15, 16 with the through-hole 8*a*.

Furthermore, the total sidewall is arranged at an angle α in a range from 30°-90° with respect to the first surface 3 of the InP-based substrate 2 in order to further optimize redistribution of mechanical stress in the layer stack 6.

Moreover, the metal layer 16 has a third surface 17 that is arranged to face away from the first surface 3 of the substrate 2. The polymer-based protective layer 12 that is arranged to cover the third surface 17 of the metal layer 16 is provided with a contact hole 18 that is configured to provide access to a third area 19 of the third surface 17 of the metal layer 16. In this way, an electrical connection can be established with the third area 19 of the third surface 17 of the metal layer 16.

FIG. 7B shows a schematic cross-section of a part of a ninth exemplary, non-limiting embodiment of the PIC 1 according to the present invention in which the first surface 3 of the InP-based substrate 2 is covered with an epitaxial InP-based semiconductor layer 4. The through-hole 8*a* is provided to all non-semiconductor layers 7*a*, 7*b* of the layer stack 6 thereby allowing direct contact between the polymer-based protective layer 12 and the second area 11*a* of the second surface 5 of the epitaxial InP-based semiconductor layer 4. As all non-semiconductor layers 7*a*, 7*b* of the layer stack 6 are provided with the through-hole 8*a*, the polymer-based protective layer 12 is in direct contact with the second area 11*a* of the second surface 5 of the epitaxial InP-based semiconductor layer 4. In this way, the combination of the polymer-based protective layer 12 and the through-hole 8a provide the mechanical coupling structure or mechanical anchor described above. As the through-hole 8a is provided in all of the non-semiconductor layers 7a, 7b of the layer stack 6, the respective sidewalls of each of these layers together constitute the total sidewall that is arranged to face the through-hole 8a. It will be clear that the total sidewall also has a differential surface in order to avoid a stress raiser in the layer stack 6 as a result of providing the non-semiconductor layers 7a, 7b with the through-hole 8a.

Furthermore, the total sidewalk is arranged at an angle α in a range from 30°-90° with respect to the first surface 3 of the InP-based substrate 2 in order to further optimize redistribution of mechanical stress in the layer stack 6.

Moreover, the polymer-based protective layer 12 has a fourth surface 20 that is arranged to face away from the first surface 3 of the InP-based substrate 2, wherein the fourth surface 20 has a contact angle β that is larger than 90°. The person skilled in the art will appreciate that for example a polymer-based surface having a contact angle of at least 50° is considered to be hydrophobic, whereas a hydrophilic polymer-based surface has a contact angle that is smaller than 50°.

FIG. 8A shows a schematic cross-section of a part of a tenth exemplary, non-limiting embodiment of the PIC 1 according to the present invention in which the fourth surface 20 of the polymer-based protective layer 12 that is arranged to face away from the first surface 3 of the InP-based substrate 2 on which it is applied is provided with indentations 21 that are arranged to provide a regular pattern 23 of protrusions 22. As a result of the regular pattern 23 of protrusions 22, said fourth surface 20 of the polymer-based protective layer 12 has an improved hydrophobicity.

Figure 8B:
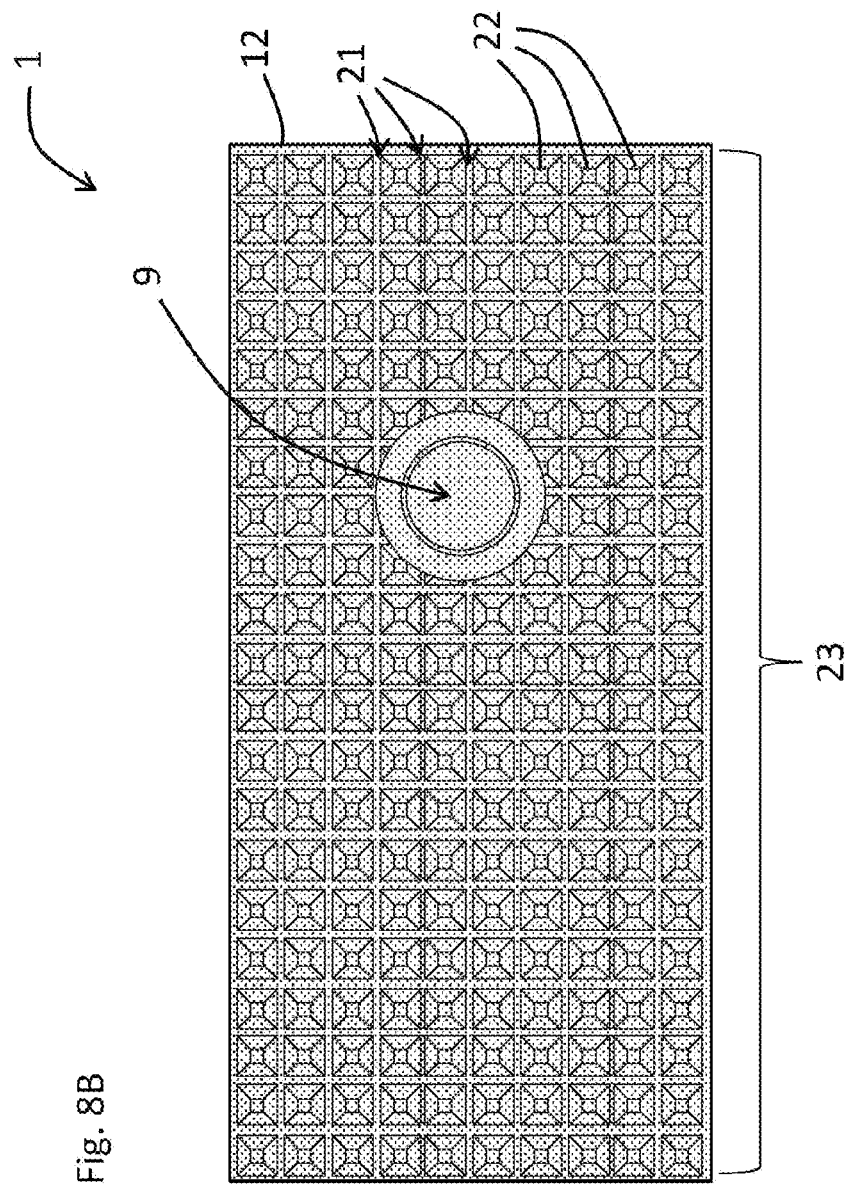
FIG. 8B shows a schematic top view of the part of the tenth exemplary, non-limiting embodiment of the environmentally protected PIC shown in FIG. 8A.

FIG. 8B shows a schematic top view of the part of the tenth exemplary, non-limiting embodiment of the PIC 1 shown in FIG. 8A. The regular pattern 23 of protrusions 22 surrounding the part of the polymer-based protective layer 12 that fills the through-hole at the predetermined location 9 can clearly be seen.

Figure 9:
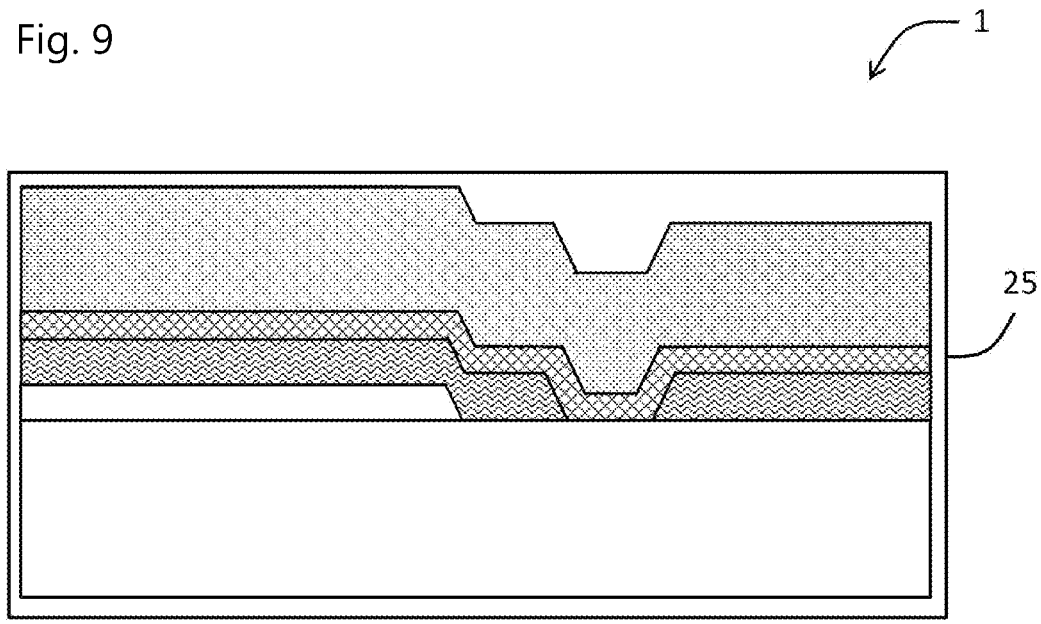
FIG. 9 shows a schematic cross-section of an eleventh exemplary, non-limiting embodiment of the environmentally protected PIC, wherein the PIC is provided with a hermetic package.

FIG. 9 shows a schematic cross-section of an eleventh exemplary, non-limiting embodiment of the environmentally protected PIC, wherein the PIC 1 is provided with a hermetic package 19. As mentioned above, the hermetic package 19 can improve the environmental protection and therefore the life-time of the PIC 1. The person skilled in the art will appreciate that the PIC can also be provided with a non-hermetic package (not shown). In the latter case, the environmental protection and consequently the life-time of the PIC can also be improved but to a lesser extent.

Figure 10:
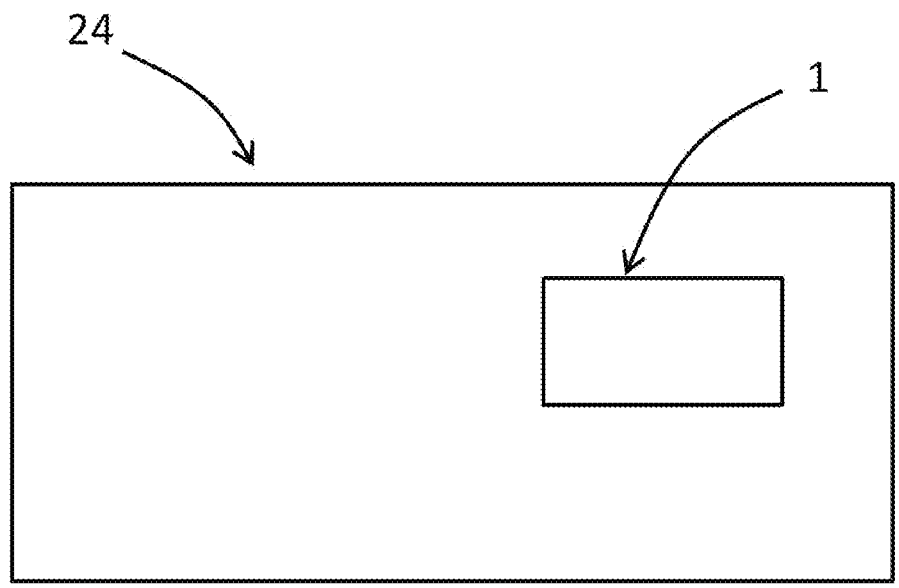
FIG. 10 shows a schematic view of a first exemplary, non-limiting embodiment of an opto-electronic system 24 comprising an environmentally protected PIC 1 according to the present invention.

FIG. 10 shows a schematic view of a first exemplary, non-limiting embodiment of an opto-electronic system 24 for telecommunication applications comprising an environmentally protected PIC 1 according to the present invention. The opto-electronic system 24 can for example be one of a transmitter, a receiver, a transceiver, a coherent transmitter, a coherent receiver and a coherent transceiver.

The present invention can be summarized as relating to an environmentally protected photonic integrated circuit, PIC 1, comprising an indium phosphide-based substrate 2 that is at least partially covered with an epitaxial semiconductor layer 4. The InP-based substrate and/or the epitaxial layer are covered with a layer stack 6 comprising different non-semiconductor layers 7a, 7b. At least a first layer of said layer stack 6 is provided with a through-hole 8a that is arranged at a predetermined location 9. The InP-based substrate 2 or epitaxial layer 4 being accessible via the through-hole 8a. Said PIC 1 comprising a dielectric protective layer 12 covering said layer stack thereby providing a mechanical coupling structure. Said protective layer is configured to protect the PIC from environmental contaminants. The invention also relates to an opto-electronic system 24 comprising said PIC 1.

It will be clear to a person skilled in the art that the scope of the present invention is not limited to the examples discussed in the foregoing but that several amendments and modifications thereof are possible without deviating from the scope of the present invention as defined by the attached claims. In particular, combinations of specific features of various aspects of the invention may be made. An aspect of the invention may be further advantageously enhanced by adding a feature that was described in relation to another aspect of the invention. While the present invention has been illustrated and described in detail in the figures and the description, such illustration and description are to be considered illustrative or exemplary only, and not restrictive.

The present invention is not limited to the disclosed embodiments. Variations to the disclosed embodiments can be understood and effected by a person skilled in the art in practicing the claimed invention, from a study of the figures, the description and the attached claims. In the claims, the word "comprising" does not exclude other steps or elements, and the indefinite article "a" or "an" does not exclude a plurality. The mere fact that certain measures are recited in mutually different dependent claims does not indicate that a combination of these measures cannot be used to advantage. Any reference numerals in the claims should not be construed as limiting the scope of the present invention.

REFERENCE NUMERALS 1 environmentally protected photonic integrated circuit (PIC)
2 indium phosphide-based (InP-based) substrate
3 first surface of the InP-based substrate
4 epitaxial semiconductor layer
5 second surface of epitaxial semiconductor layer
6 layer stack
7a,7b different non-semiconductor layers
8a,8b,8c,8d through-hole
9 predetermined location of elevated mechanical stress
10 first area of the first surface of the InP-based substrate
11a,11b,11c second area of the second surface of the epitaxial semiconductor layer
12 dielectric protective layer
13 predefined though-hole pattern
14a,14b,14c sidewall of at least one layer of the layer stack facing a through-hole
α angle of sidewall with respect to first surface of the InP-based substrate
15 dielectric layer
16 metal layer
17 third surface of the metal layer
18 contact hole
19 third area of the third surface of the metal layer
20 fourth surface of the polymer-based protective layer
21 indentation
22 protrusion
β contact angle of the fourth surface of the dielectric protective layer
t thickness of the dielectric protective layer
23 regular pattern of protrusions
24 opto-electronic system
25 hermetic package

The invention claimed is:

1. An environmentally protected photonic integrated circuit, comprising:
   an indium phosphide-based, InP-based, substrate having a first surface that is at least partially covered with an epitaxial semiconductor layer that has a second surface that is arranged to face away from the first surface of the InP-based substrate;
   a layer stack that comprises at least two different non-semiconductor layers, the layer stack being arranged to cover the first surface of the InP-based substrate and/or the second surface of the epitaxial semiconductor layer, wherein
      at least a layer of said layer stack that is in contact with the first surface of the InP-based substrate and/or the second surface of the epitaxial semiconductor layer is provided with a through-hole that is arranged at a predetermined location; and
      a first area of the first surface of the InP-based substrate or a second area of the second surface of the epitaxial semiconductor layer is accessible via the through-hole; and
   a dielectric protective layer that is arranged to cover said layer stack, the dielectric protective layer being arranged to at least partially fill the through-hole or a recess in said layer stack at the predetermined location thereby providing a mechanical coupling structure, the dielectric protective layer having material properties and dimensions that are configured to enable protection of the photonic integrated circuit from environmental contaminants.

2. The environmentally protected photonic integrated circuit according to claim 1, wherein at least the layer of said layer stack that is in contact with the first surface of the InP-based substrate and/or the second surface of the epitaxial semiconductor layer is provided with at least two through-holes that are arranged in accordance with a predetermined through-hole pattern.

3. The environmentally protected photonic integrated circuit according to claim 1, wherein at least the layer of said layer stack that is in contact with the first surface of the InP-based substrate and/or the second surface of the epitaxial semiconductor layer has a sidewall that is arranged to face the through-hole, the sidewall having a differential surface.

4. The environmentally protected photonic integrated circuit according to claim 2, wherein at least the layer of said layer stack that is in contact with the first surface of the InP-based substrate and/or the second surface of the epitaxial semiconductor layer has at least two sidewalls, each of said at least two sidewalls being arranged to face a respective through-hole of said at least two through-holes that are arranged in accordance with the predetermined through-hole pattern, each of said at least two sidewalls having a differential surface.

5. The environmentally protected photonic integrated circuit according to claim 3, wherein the sidewall is arranged at an angle, a, in a range from 30°-90° with respect to the first surface of the InP-based substrate.

6. The environmentally protected photonic integrated circuit according to claim 1, wherein said layer stack comprises a dielectric layer and a metal layer.

7. The environmentally protected photonic integrated circuit according to claim 6, wherein the metal layer has a third surface that is arranged to face away from the first surface of the InP-based substrate, the dielectric protective layer being arranged to cover the third surface of the metal layer, the dielectric protective layer being provided with a contact hole that is configured to provide access to a third area of the third surface of the metal layer.

8. The environmentally protected photonic integrated circuit according to claim 1, wherein the dielectric protective layer is a polymer-based layer that comprises one of a polyacrylate, a polycarbonate, a polyimide, a polyurethane, a polyxylylene, a benzocyclobutene, a polysiloxane, and silicon.

9. The environmentally protected photonic integrated circuit according to claim 1, wherein the dielectric protective layer comprises at least one of an organic additive and an inorganic additive.

10. The environmentally protected photonic integrated circuit according to claim 1, wherein the dielectric protective layer comprises a fourth surface that is arranged to face away from the first surface of the InP-based substrate, the dielectric protective layer being provided with indentations that are arranged to provide a regular pattern of protrusions at the fourth surface.

11. The environmentally protected photonic integrated circuit according to claim 10, wherein the fourth surface of the dielectric protective layer has a contact angle, β, that is at least 50°.

12. The environmentally protected photonic integrated circuit according to claim 1, wherein the dielectric protective layer has a thickness, t, between 0.5 μm and 100 μm, preferably between 0.5 μm and 10 μm.

13. The environmentally protected photonic integrated circuit according to claim 1, wherein the dielectric protective layer is a conformal coating or a planarizing coating.

14. The environmentally protected photonic integrated circuit according to claim 1, wherein the photonic integrated circuit is provided with one of a non-hermetic package and a hermetic package.

15. An opto-electronic system comprising an environmentally protected photonic integrated circuit according to claim 1, wherein the opto-electronic system is one of a transmitter, a receiver, a transceiver, a coherent transmitter, a coherent receiver and a coherent transceiver.

16. The environmentally protected photonic integrated circuit according to claim 6, wherein the metal layer has a third surface that is arranged to face away from the first surface of the InP-based substrate, the dielectric protective layer being arranged to cover the third surface of the metal layer, the dielectric protective layer being provided with a contact hole that is configured to provide access to a third area of the third surface of the metal layer, and wherein the dielectric protective layer is a polymer-based layer that comprises one of a polyacrylate, a polycarbonate, a polyimide, a polyurethane, a polyxylylene, a benzocyclobutene, a polysiloxane, and silicon.

17. The environmentally protected photonic integrated circuit according to claim 16, wherein the dielectric protective layer comprises at least one of an organic additive and an inorganic additive, and wherein the dielectric protective layer comprises a fourth surface that is arranged to face away from the first surface of the InP-based substrate, the dielectric protective layer being provided with indentations that are arranged to provide a regular pattern of protrusions at the fourth surface.

18. The environmentally protected photonic integrated circuit according to claim 17, wherein the fourth surface of the dielectric protective layer has a contact angle, β, that is at least 50°, and wherein the dielectric protective layer has a thickness, t, between 0.5 μm and 100 μm, preferably between 0.5 μm and 10 μm.

19. The environmentally protected photonic integrated circuit according to claim 18, wherein the dielectric protective layer is a conformal coating or a planarizing coating, and wherein the photonic integrated circuit is provided with one of a non-hermetic package and a hermetic package.

20. An opto-electronic system comprising an environmentally protected photonic integrated circuit according to claim 19, wherein the opto-electronic system is one of a transmitter, a receiver, a transceiver, a coherent transmitter, a coherent receiver and a coherent transceiver.

* * * * *

UNITED STATES PATENT AND TRADEMARK OFFICE
CERTIFICATE OF CORRECTION

| | | |
|---|---|---|
| PATENT NO. | : 12,125,805 B2 | Page 1 of 1 |
| APPLICATION NO. | : 17/541374 | |
| DATED | : October 22, 2024 | |
| INVENTOR(S) | : Hoekstra | |

It is certified that error appears in the above-identified patent and that said Letters Patent is hereby corrected as shown below:

In the Claims

In Claim 5, Column 17, Line 58, replace "a," with --α,--

Signed and Sealed this
Tenth Day of December, 2024

Katherine Kelly Vidal
*Director of the United States Patent and Trademark Office*